(12) United States Patent
Zhao et al.

(10) Patent No.: US 8,834,582 B2
(45) Date of Patent: Sep. 16, 2014

(54) APPARATUS FOR MANUFACTURING SEMICONDUCTOR WAFER

(75) Inventors: Hongyu Zhao, Beijing (CN); Xiaohong Zhang, Beijing (CN); Likun Pei, Beijing (CN); Bao Zhang, Beijing (CN); Ruiting Wang, Beijing (CN)

(73) Assignee: Beijing Sevenstar Electronics Co., Ltd., Beijing (CN)

( * ) Notice: Subject to any disclaimer, the term of this patent is extended or adjusted under 35 U.S.C. 154(b) by 129 days.

(21) Appl. No.: 13/701,880

(22) PCT Filed: Jun. 13, 2012

(86) PCT No.: PCT/CN2012/076832
§ 371 (c)(1),
(2), (4) Date: Dec. 4, 2012

(87) PCT Pub. No.: WO2013/097420
PCT Pub. Date: Jul. 4, 2013

(65) Prior Publication Data
US 2013/0160261 A1    Jun. 27, 2013

(30) Foreign Application Priority Data
Dec. 26, 2011   (CN) .......................... 2011 1 0441994

(51) Int. Cl.
*H01L 29/00*     (2006.01)
*H01L 21/67*     (2006.01)
*H01L 21/677*    (2006.01)

(52) U.S. Cl.
CPC ..... *H01L 21/67769* (2013.01); *H01L 21/67742* (2013.01); *H01L 21/67766* (2013.01); *H01L 21/67017* (2013.01)
USPC ...................................................... 29/25.01

(58) Field of Classification Search
USPC ........................................................ 29/25.01
See application file for complete search history.

(56) References Cited

U.S. PATENT DOCUMENTS

2011/0153114 A1* 6/2011 Jingu et al. ................... 700/301

* cited by examiner

*Primary Examiner* — Timor Karimy
(74) *Attorney, Agent, or Firm* — Anova Law Group, PLLC

(57) ABSTRACT

The present invention provides an apparatus for manufacturing semiconductor wafer comprising at least two manipulators, at least one set of chemical gas/liquid distribution unit and an air circulating and filtering unit. The air circulating and filtering unit is separated into three regions, including the front region, the middle region, and the side region, which are controlled by respective control electric motors to achieve uniform air flow and uniform pressure in the respective regions. The cleaning degree in the internal of the apparatus can be improved by the regional control of the air circulating and filtering unit; the wafer transport efficiency can be enhanced by the double-armed manipulators having multiple degrees of freedom; and the product yield per unit area can be increased by the chemical gas/liquid distribution unit providing stable and uniform gas/liquid flow and pressure.

7 Claims, 2 Drawing Sheets

APPARATUS FOR MANUFACTURING SEMICONDUCTOR WAFER

CROSS-REFERENCE TO RELATED APPLICATION

This application claims the priority benefit of China application serial no. 201110441994.7, filed Dec. 26, 2011. All disclosure of the China application is incorporated herein by reference.

FIELD OF THE INVENTION

The present invention relates to the field of semiconductor manufacturing technology, and more particularly to an apparatus for manufacturing semiconductor wafers.

BACKGROUND OF THE INVENTION

In a conventional apparatus for manufacturing semiconductor wafers, the air circulating and filtering unit of the apparatus utilizes a single control electric motor to control the air flow and the pressure in the whole apparatus, thus the internal of the apparatus may not reach a high cleaning degree. Furthermore, since the apparatus generally utilizes a single-armed manipulator which processes only one wafer at a time with less degree of freedom and small covering area, the wafer transport efficiency is low. In addition, due to the uneven distribution of the chemical gas/liquid distribution unit in the apparatus, the flow and pressure in each process chamber is different, which affects the product yield rate per unit area.

SUMMARY OF THE INVENTION

Accordingly, at least one objective of the present invention is to provide an apparatus for manufacturing semiconductor wafers to improve the cleaning degree in the inner of the apparatus, and enhance the wafer transport efficiency as well as the product yield per unit area. To achieve these and other advantages and in accordance with the objective of the invention, as embodied and broadly described herein, the invention provides an apparatus for manufacturing semiconductor wafers, comprising at least two manipulators, at least one set of chemical gas/liquid distribution unit and an air circulating and filtering unit, wherein, the air circulating and filtering unit comprises multiple control electric motors for achieving uniform air flow and uniform pressure in the respective regions controlled thereby.

According to the concept of the present invention, the manipulator is a double-armed manipulator having multiple degrees of freedom.

According to the concept of the present invention, the apparatus for manufacturing semiconductor wafers further comprises multiple process units having a process chamber, at least one storing and adjusting unit and a transport region of the wafer; one of the manipulators is a wafer access manipulator for placing a processed wafer picked up from the process unit into a storing and adjusting unit, meanwhile placing the unprocessed wafer into the process unit for processing.

According to the concept of the present invention, the components in the internal of the chemical gas/liquid distribution unit are symmetrically positioned.

According to the concept of the present invention, the apparatus for manufacturing semiconductor wafers further comprises multiple static eliminators covering the transport region of the wafers respectively.

According to the concept of the present invention, the regions controlled by the multiple control electric motors include a front region, a middle region and a side region; the transport region of the wafer includes the front region and the middle region; the multiple process chambers are symmetrically arranged in the side region in two lines.

According to the concept of the present invention, the apparatus for manufacturing semiconductor wafers further comprises multiple valve module units symmetrically disposed in the side region and below the process chambers.

In the present invention, the cleaning degree in the internal of the apparatus for manufacturing semiconductor can be improved through regional control by the air circulating and filtering unit, the wafer transport efficiency can be enhanced by utilizing the double-armed manipulator having multiple degrees of freedom, and the product yield per unit area can be increased by the chemical gas/liquid distribution unit providing stable and uniform flow and pressure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE EMBODIMENTS

Figure 1:
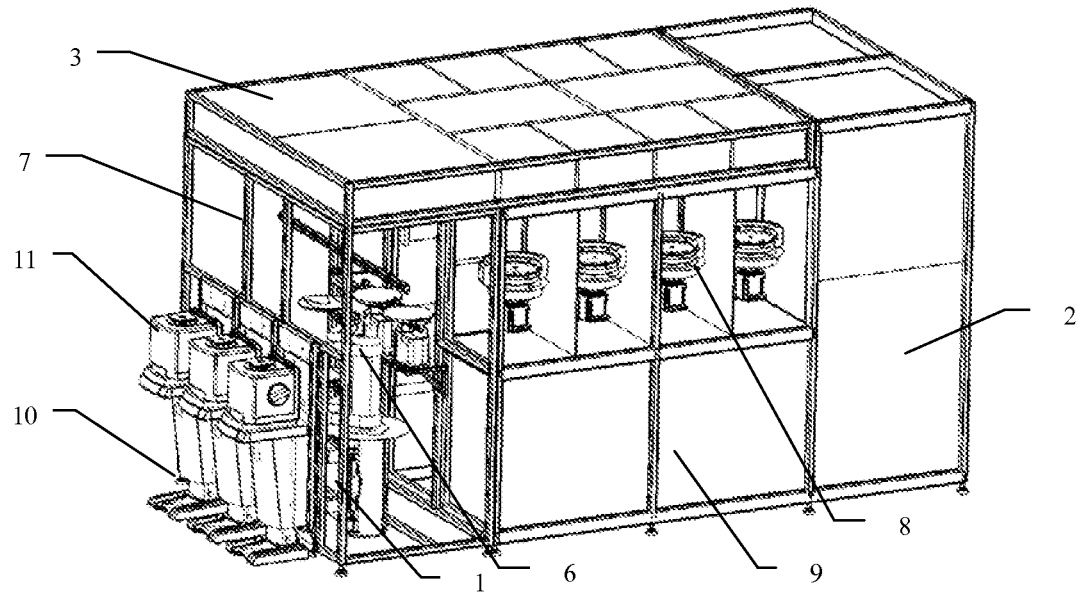
FIG. 1 is a view of the apparatus for manufacturing semiconductor wafer in one embodiment of the present invention.

An apparatus for manufacturing semiconductor wafer will be described in further details hereinafter with respect to the embodiment of the present invention and the accompanying drawings.

Reference will now be made in detail to the present preferred embodiments of the invention, examples of which are illustrated in the accompanying drawings. Wherever possible, the same reference numbers are used in the drawings and the description to refer to the same or like parts.

FIG. 1 illustrates an apparatus for manufacturing semiconductor wafers according to an embodiment of the present invention. The apparatus comprises at least two manipulators for transporting the wafers, at least a set of chemical gas/liquid distribution units 2 and an air circulating and filtering unit 3.

Figure 2:
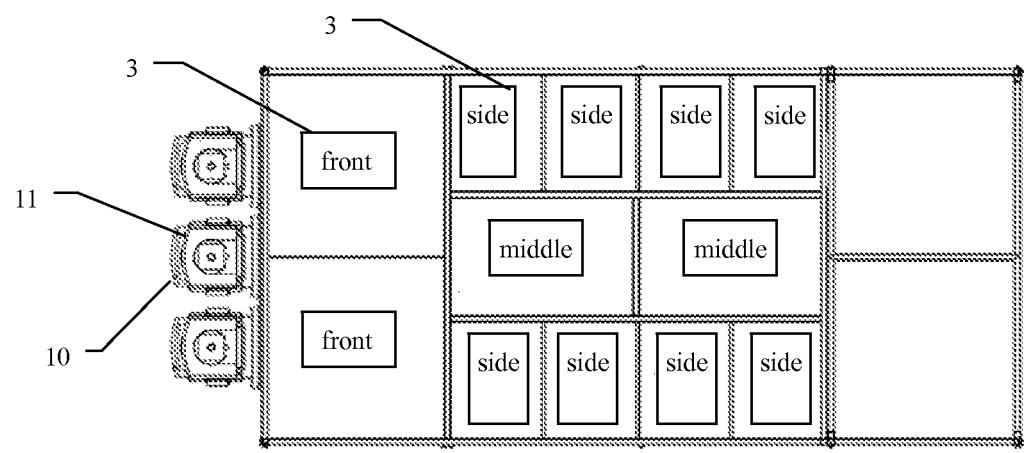
FIG. 2 is a top view of the external of the apparatus for manufacturing semiconductor wafer in one embodiment of the present invention.

The air circulating and filtering unit 3 comprises a plurality of control electric motors to achieve the airflow uniformity and the pressure uniformity in the regions controlled thereby. Referring to FIG. 2 of the drawings, the air circulating and filtering unit 3 is separated into three regions, including the front region, the middle region, and the side region. The two small parts in the front region are controlled by an electric motor to achieve uniform air flow and uniform pressure in the front region; the two small parts in the middle region are controlled by another electric motor to achieve uniform air flow and uniform pressure in the middle region; the eight small parts in the side region are controlled by eight independent electric motors respectively to achieve uniform air flow and uniform pressure in each small part of the side region. In general, the pressure in the side region is higher than that in the middle region, and the pressure in the middle region is higher than that in the front region. The apparatus for manufacturing semiconductor wafers further comprises multiple process units 5 having a process chamber 8, at least one rotating and adjusting unit 6 and a transport region of the wafer. Preferably, the process chambers 8 are symmetrically arranged in the side region in two lines. The transport region of the wafer includes the front region and the middle region mentioned above. The manipulators are double-armed manipulators having multiple degrees of freedom. In an embodiment, two manipulators are provided, including a manipulator 1 and a wafer access manipulator 4 for transporting the wafer in the transport region. The manipulator 4 is used for placing the processed wafers picked up from the process unit 5 into the storing and adjusting unit 6, meanwhile placing the unprocessed wafers picked up from the storing and adjusting unit 6 into the process unit 5.

The components in the internal of the chemical gas/liquid distribution unit 2 are arranged symmetrically. The apparatus also comprises a plurality of static eliminators 7 covering the transport region of the wafers respectively.

In addition, the apparatus for manufacturing semiconductor wafers further comprises multiple valve module units 9. The valve module units 9 are symmetrically arranged in the side region and below the process chambers 8 of the process units 5.

The operation process of the apparatus for manufacturing semiconductor wafers of an embodiment of the present invention will be described as follows in further details:

In the initial operation of the apparatus, the wafer loading port 10 of the apparatus receives wafer cassettes 11 from the factory; the manipulator 1 picks up the wafer from the wafer cassette 11, and transports the wafer into the storing and adjusting unit 6 for rotating to adjust the position of the wafer and reading the wafer code; then the wafer access manipulator 4 picks up the wafer in the storing and adjusting unit 6 and transports the wafer to the process chamber 8 of the process unit 5;

when the process is complete, the wafer access manipulator 4 picks up the processed wafer from the process chamber 8 and transports it to the storing and adjusting unit 6, meanwhile picks up the unprocessed wafer in the storing and adjusting unit 6 and transports it to the process chamber; the manipulator 1 picks up the former processed wafer in the storing and adjusting unit 6 and transports it into the wafer cassette 11, meanwhile picks up another wafer in the wafer cassette 11 and transports it into the storing and adjusting unit 6 for rotating to adjust the position and code reading. The process mentioned above can be repeated.

In the stable operation, the wafer access manipulator 4 picks up the processed wafer from the process chamber 8 of the process unit 5, and then transports another unprocessed wafer into the process chamber 8. Since the wafer access manipulator 4 is a double-armed manipulator, it can clamp two wafers at a same time. When the wafer access manipulator 4 moves to the process chamber 8 with one hand empty and the other hand clamping the unprocessed wafer, the empty hand will pick up the processed wafer from the process chamber 8 and the other hand will subsequently transport the unprocessed wafer into the process chamber 8.

Figure 3:
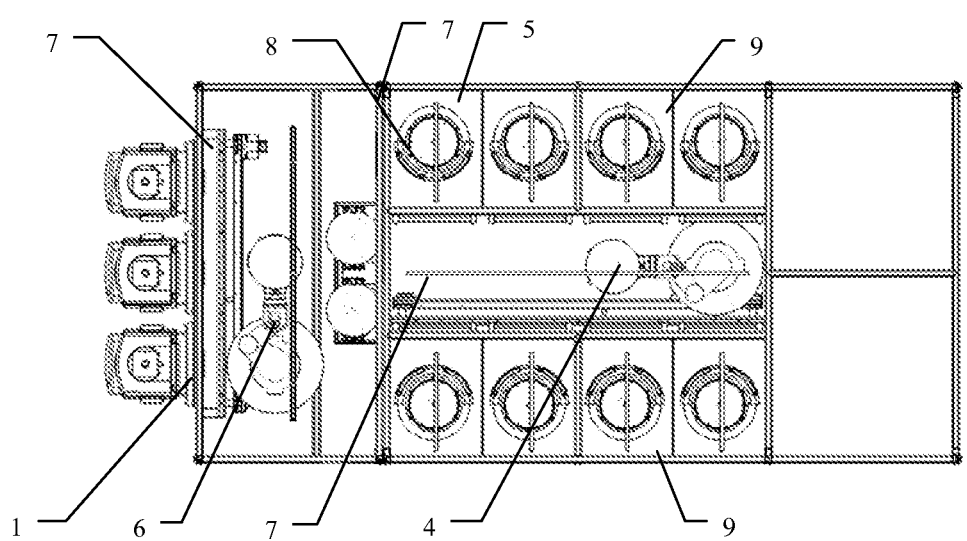
FIG. 3 is a top view of the internal of the apparatus for manufacturing semiconductor wafer in one embodiment of the present invention.

Referring to FIG. 3, eight process chambers 8 with the same function are provided. Specifically, the wafer access manipulator 4 can transport the unprocessed wafer to a nearest process chamber 8 or to a process chamber 8 already having a processed wafer therein. In the latter case, the wafer access manipulator 4 first picks up the processed wafer and then places the unprocessed wafer into the process chamber 8.

Referring to FIG. 1, two storing and adjusting units 6 with the same function are provided. Each of the storing and adjusting units 6 comprises an upper layer and a bottom layer for storing two wafers. The upper layer stores the processed wafer and performs the function of transferring; the bottom layer stores the unprocessed wafer and performs the function of transferring, rotating and position adjusting, and cord reading.

During the operation of the apparatus, the air circulating and filtering unit 3 and the static eliminators 7 function together; wherein the air circulating and filtering unit 3 outputs vertical laminar flow from up to down, the static eliminators 7 output vertical plasma flow from up to down.

In summary, in the present invention, the apparatus for manufacturing semiconductor wafer utilizes the air circulating and filtering unit to perform regional control to improve the cleaning degree in the internal of the apparatus; in addition, the apparatus utilizes double-armed manipulators having multiple degrees of freedom to enhance the wafer transport efficiency ; furthermore, the chemical gas/liquid distribution unit of the apparatus providing stable and uniform flow and pressure increases the product yield per unit area which provides industrial application.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. An apparatus for manufacturing semiconductor wafers, comprising:
   a casing with a cavity formed therein, the cavity comprises a front region, a middle region, and a side region having multiple parts arranged in two lines on opposing sides of the middle region; each part is provided with a process unit for processing wafers;
   a storing and adjusting unit arranged in the front region having an upper layer for storing a processed wafer and a bottom layer for storing an unprocessed wafer;
   a wafer loading port;
   at least one set of chemical gas/liquid distribution unit;
   an air circulating and filtering unit outputting vertical laminar flow from up to down, wherein the air circulating and filtering unit comprises multiple control electric motors to control the air flow and the pressure in the front region, the middle region and the side region;
   a first manipulator and a second manipulator for transporting wafers in a transport region formed by the front region and the middle region; wherein during the operation process of the apparatus, the first manipulator transports the processed wafer from the upper layer to the wafer loading port, meanwhile transports another unprocessed wafer from the wafer loading port to the bottom layer; the second manipulator transports another processed wafer from one of the process units to the upper layer, meanwhile transports the unprocessed wafer from the bottom layer to one of the process units; and
   a plurality of static eliminators covering the transport region respectively and functioning together with the air circulating and filtering unit to output vertical plasma flow from up to down.

2. The apparatus according to claim 1, wherein each of the first manipulator and the second manipulator is a double-armed manipulator having multiple degrees of freedom.

3. The apparatus according to claim 1, wherein the components in the internal of the chemical gas/liquid distribution unit are symmetrically positioned.

4. The apparatus according to claim 1, wherein the multiple control electric motors controls the air flow and the pressure in all parts of each of the front region, the middle region and the side region to be uniform.

5. The apparatus according to claim 4, wherein the front region comprises two parts which are controlled by one of the electric motors to achieve uniform air flow and uniform pressure in the front region; the middle region comprises two parts which are controlled by another one of the electric motors to achieve uniform air flow and uniform pressure in the middle region; the side region comprises eight parts which are controlled by eight of the electric motors respectively to achieve uniform air flow and uniform pressure in the side region.

6. The apparatus according to claim 4, wherein the pressure in the side region is higher than that in the middle region, and the pressure in the middle region is higher than that in the front region.

7. The apparatus according to claim 1, further comprising multiple valve module units symmetrically disposed in the side region and below the process chambers.

* * * * *